United States Patent

Bertin et al.

[11] Patent Number: 6,111,425
[45] Date of Patent: Aug. 29, 2000

[54] VERY LOW POWER LOGIC CIRCUIT FAMILY WITH ENHANCED NOISE IMMUNITY

[75] Inventors: Claude L. Bertin, South Burlington; Russell J. Houghton, Essex Junction; Wilbur D. Pricer, Charlotte; William R. Tonti, Essex Junction, all of Vt.

[73] Assignee: International Business Machines Corporation, Armonk, N.Y.

[21] Appl. No.: 09/173,436

[22] Filed: Oct. 15, 1998

[51] Int. Cl.[7] .................................................. H03K 17/16
[52] U.S. Cl. ................................. 326/21; 326/23; 326/83
[58] Field of Search ................................ 326/21–23, 26, 326/27, 83; 327/55, 67

[56] References Cited

U.S. PATENT DOCUMENTS

| | | | |
|---|---|---|---|
| 4,307,333 | 12/1981 | Hargrove | 326/83 |
| 4,689,504 | 8/1987 | Raghunathan et al. | |
| 4,980,583 | 12/1990 | Dietz | 326/68 |
| 5,274,275 | 12/1993 | Colles | 326/115 |
| 5,473,268 | 12/1995 | Declereq et al. | |
| 5,504,442 | 4/1996 | Tanoi | 327/51 |
| 5,510,731 | 4/1996 | Dingwall | |
| 5,548,231 | 8/1996 | Tran | 327/55 |
| 5,606,268 | 2/1997 | Van Brunt | |
| 5,650,742 | 7/1997 | Hirano | |
| 5,793,226 | 8/1998 | Park et al. | 326/86 |

OTHER PUBLICATIONS

IBM Technical Disclosure Bulletin, vol. 32, No. 1, Jun. 1989, "NMOS Control Circuit For A CMOS Three–State Driver".

*Primary Examiner*—Michael Tokar
*Assistant Examiner*—Don Phu Le
*Attorney, Agent, or Firm*—Scully, Scott, Murphy & Presser; Eugene I. Shkurko, Esq.

[57] ABSTRACT

A very low power logic circuit family which advantageously provides 1) retained high performance, 2) significantly reduced power dissipation, and 3) enhanced noise immunity. In a first set of embodiments, dual rail complementary logic signals are utilized to improve circuit immunity to external noise and to reduce noise generated by the logic circuit itself. A receiver portion of the present invention comprises two input FETs having cross coupling of the two gates to the two sources. In one preferred embodiment, both receiver and driver portions are connected in a repeater with all N channel drivers. A second set of embodiments have a single sided input in an unbalanced receiver comprising cross coupled source to gate N channel and cross coupled drain to gate P channel output transistors.

18 Claims, 12 Drawing Sheets

VERY LOW POWER LOGIC CIRCUIT FAMILY WITH ENHANCED NOISE IMMUNITY

BACKGROUND OF THE INVENTION

1. Technical Field

The present invention relates generally to a very low power logic circuit family with enhanced noise immunity, and more particularly pertains to a very low power logic circuit family which advantageously provides 1) retained high performance, 2) significantly reduced power dissipation, and 3) enhanced noise immunity.

A growing list of applications require low power electronic circuits. Some applications are portable and battery power. Other examples include complex designs which have simply exceeded their power budget. Decreasing the power supply is perhaps the most effective way to reduce power dissipation. In CMOS circuits the power dissipated is very nearly proportional to the square of the power supply voltage. Simply reducing the voltage to a given logic circuit in a given technology, however, leads to two additional and undesired results. The circuits become slower and more sensitive to noise generated by external sources.

The present invention lowers power dissipation in a broad family of logic circuits while avoiding the two undesired results of the circuits becoming slower and more sensitive to noise generated by external sources.

2. Prior Art

FIG. 1 depicts a relevant prior art circuit developed by Knepper. In the 1970's Knepper developed a way to reduce logic voltage swings over logic networks while maintaining larger logic signal swings within the logic gates. The technology of choice at that time was Depletion Load NMOS; and the development was applied to improve performance, not to decrease power. FIG. 1 illustrates this prior art circuit having a single logic input signal to an input transistor 10, coupled to vdd or Vref, and a second transistor 12, coupled to Vdd, with an output to logic gates 14.

Two decades later Nakagome applied a similar technique in CMOS to decease the logic voltage swings on logic buses, this time to save power. FIG. 2 illustrates an exemplary circuit as developed by Nakagome to decrease the logic voltage swings on logic buses to save power, and comprising a bus driver circuit having a source offset driver (a) and an internal supply generator (b).

It is noted that both of the above described pieces of prior art are "single ended" not differential.

SUMMARY OF THE INVENTION

Accordingly, it is a primary object of the present invention to provide a very low power logic circuit family with enhanced noise immunity.

The present invention advantageously provides 1) retained high performance, 2) significantly reduced power dissipation, and 3) enhanced noise immunity.

A further object of the subject invention is the provision of low power logic circuits with enhanced noise immunity which are fully compatible with standard CMOS logic. Because the receiver restores the signal levels internally to Vdd and Ground, conventional CMOS gates can be driven directly from the inventive circuits. Likewise, the output of conventional CMOS gates can be connected directly to any logic/driver input of the present invention. The logic circuits of the subject invention will also interface with otherwise identical circuits operating at different Vsh or Vdd power supplies. This is because the receiver portion uses differential sensing, and thus no internal logic reference level is needed at the receiving end.

The present invention provides low power logic circuits with enhanced noise immunity in which power reduction is achieved at the cost of a second power supply, which can be derived from on-chip voltage regulators or voltage doublers. The power reduction can be from 4× to 7× lower power.

BRIEF DESCRIPTION OF THE DRAWINGS

The foregoing objects and advantages of the present invention for a very low power logic circuit family with enhanced noise immunity may be more readily understood by one skilled in the art with reference being had to the following detailed description of several preferred embodiments thereof, taken in conjunction with the accompanying drawings wherein like elements are designated by identical reference numerals throughout the several views, and in which.

4B illustrates the two input FETs cross coupled source to back gate.

Figure 4A:
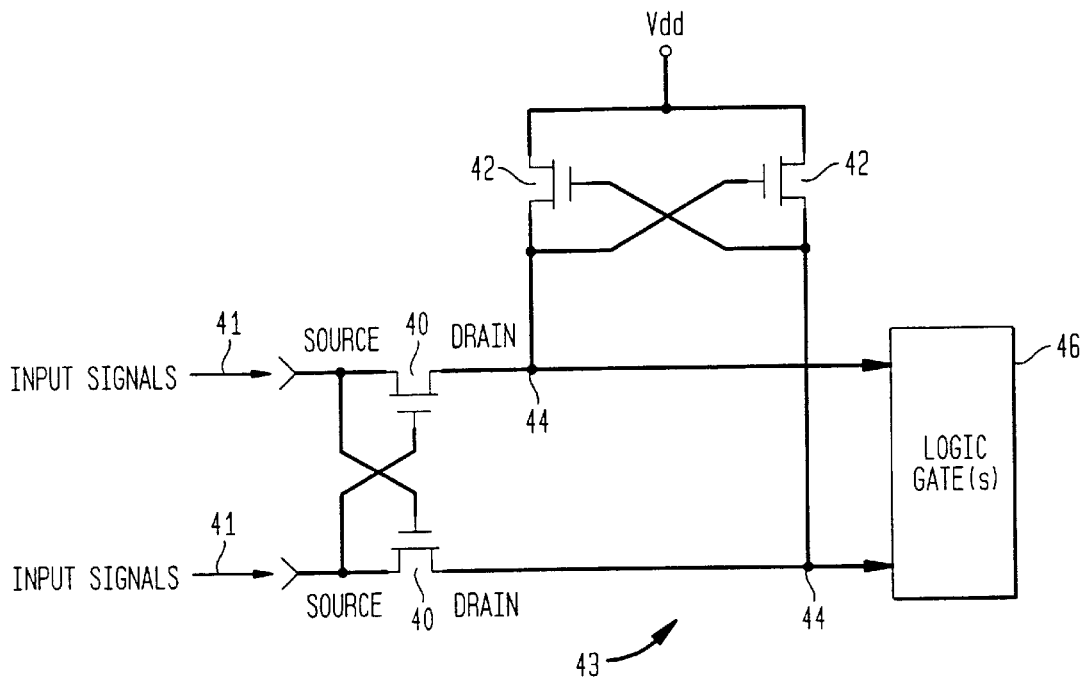
FIGS. 4A, 4B and 4C illustrate three preferred embodiments of a receiver portion of the present invention having cross coupling of the two gates to the two sources of two input FETs.
Figure 4B:
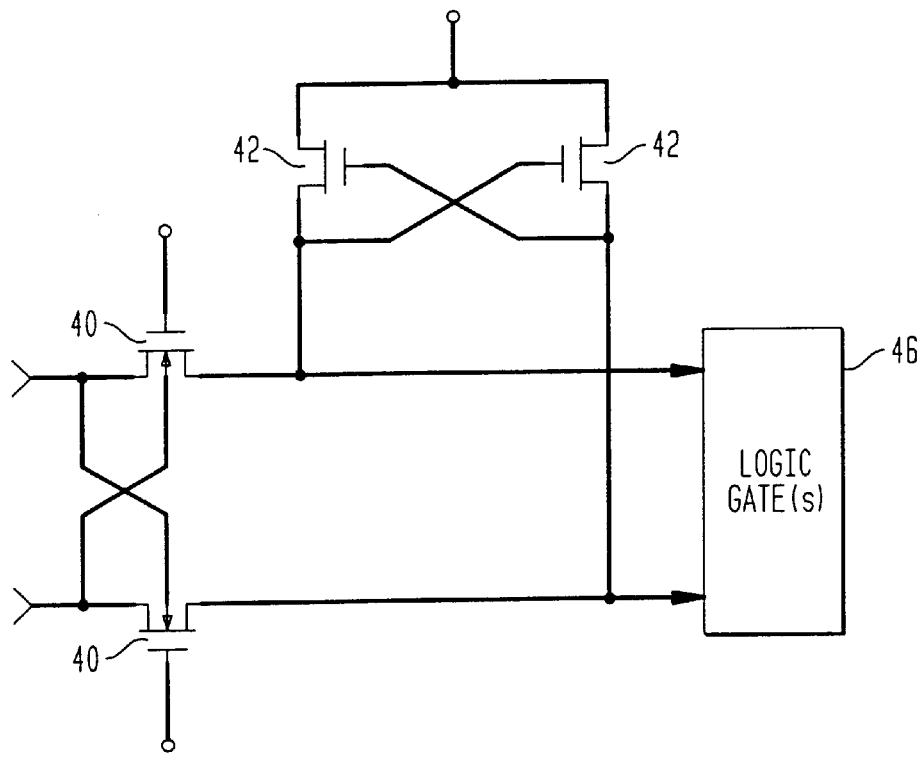
Figure 4C:
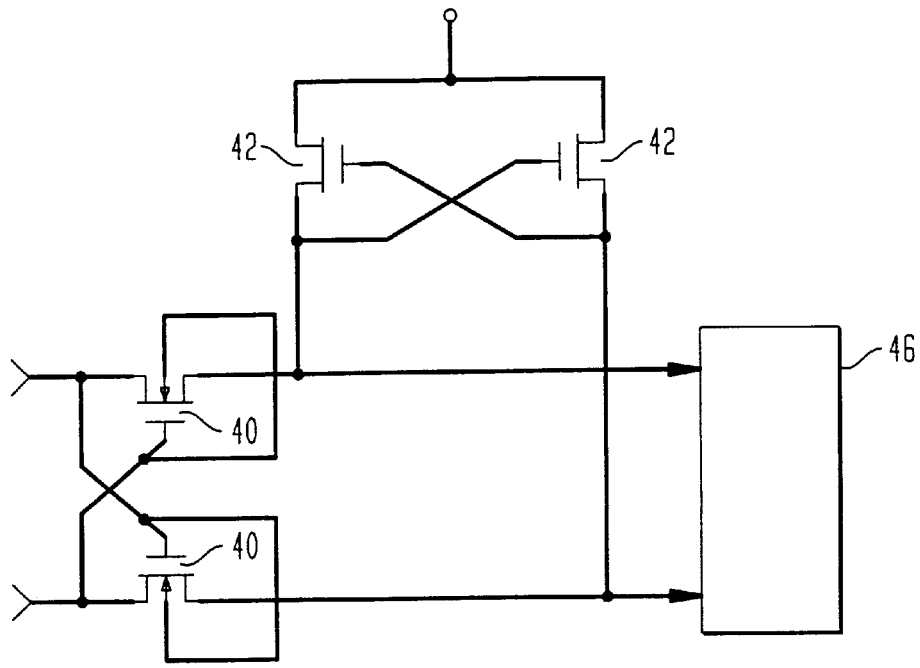

FIG. 4C illustrates the two input FETs cross coupled source to both front and back gates.

Figure 5:
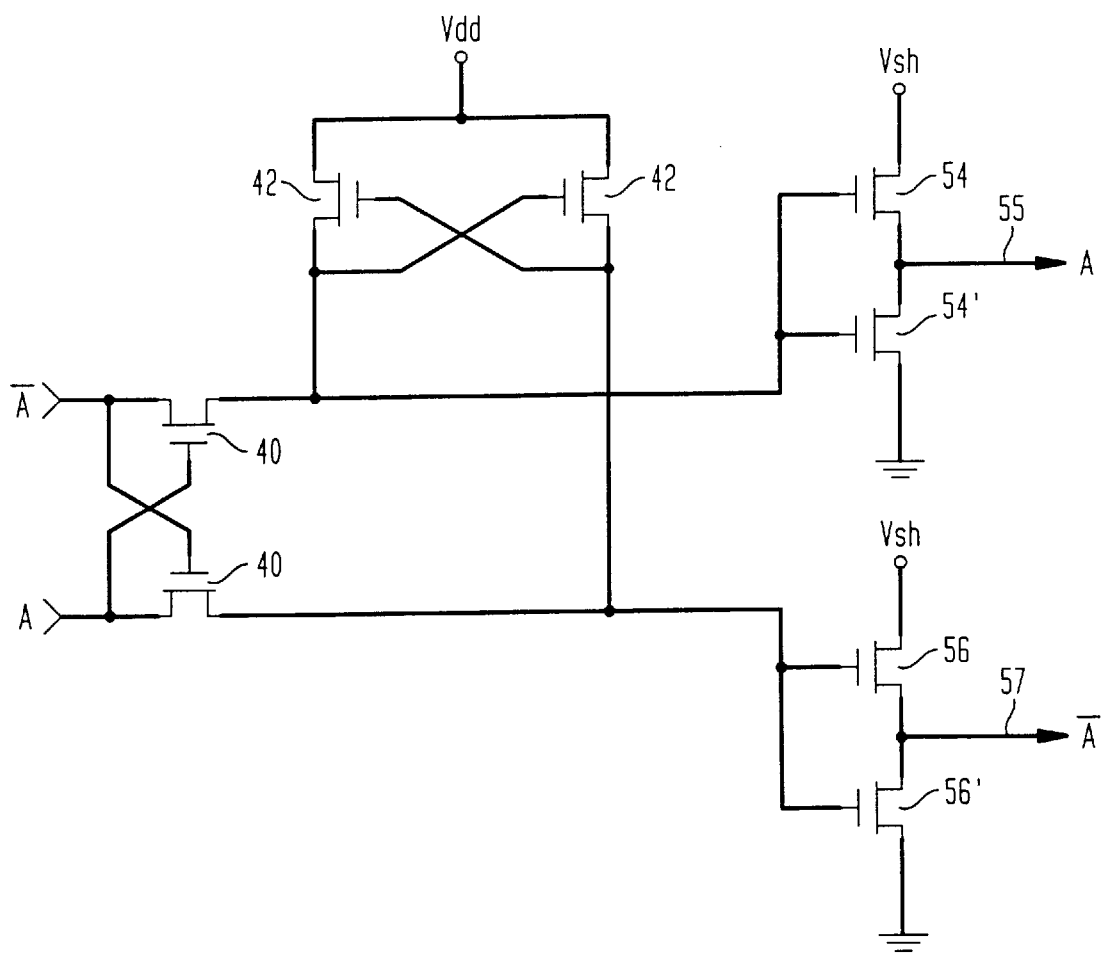

FIG. 5 illustrates a repeater which comprises a preferred receiver appended by two traditional CMOS inverter/drivers, such as could be used on long distance signal lines to defeat RC build up and enhance performance. In this embodiment the two traditional CMOS inverter/drivers are supplied with a reduced voltage power supply Vsh. The embodiment of FIG. 5 is preferred when Vsh is relatively close to Vdd.

Figure 6:
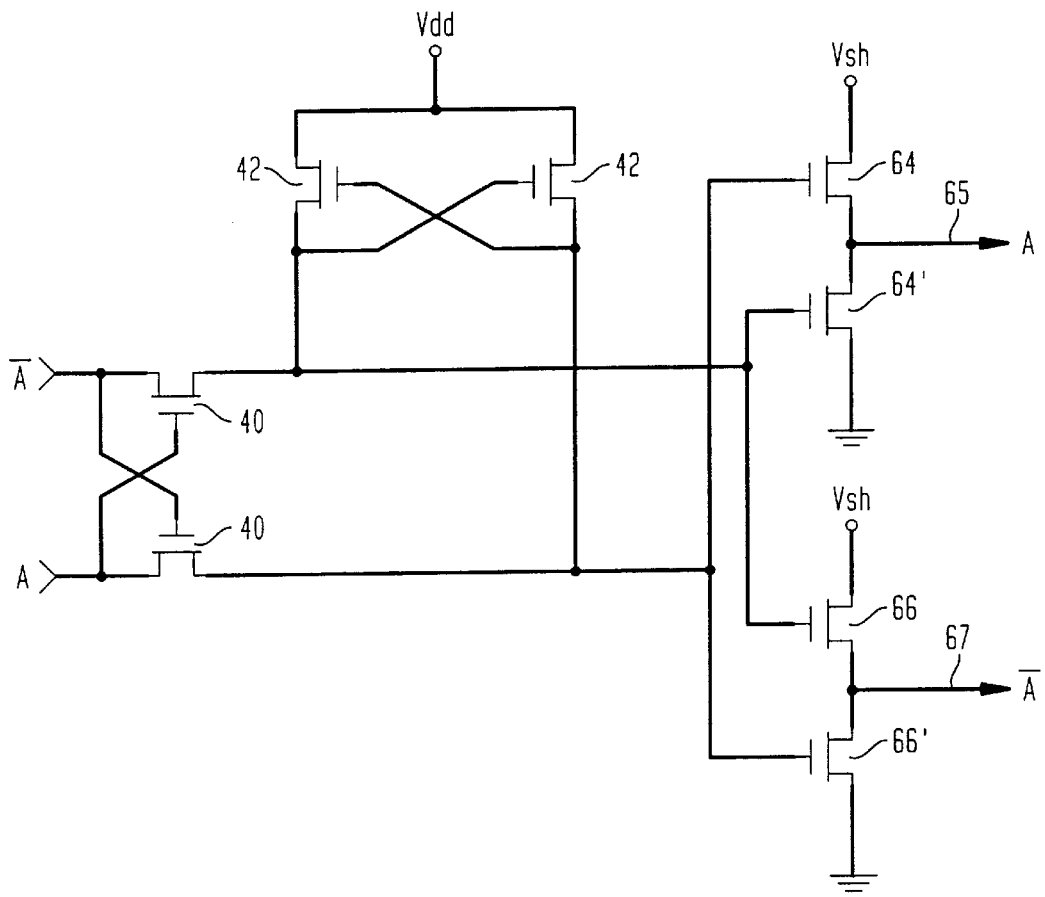

FIG. 6 depicts an embodiment of the full invention with both preferred receiver and driver portions connected in a repeater with all N channel drivers. The embodiment of FIG. 6 is preferred when Vsh is much less than Vdd.

Figure 6A:
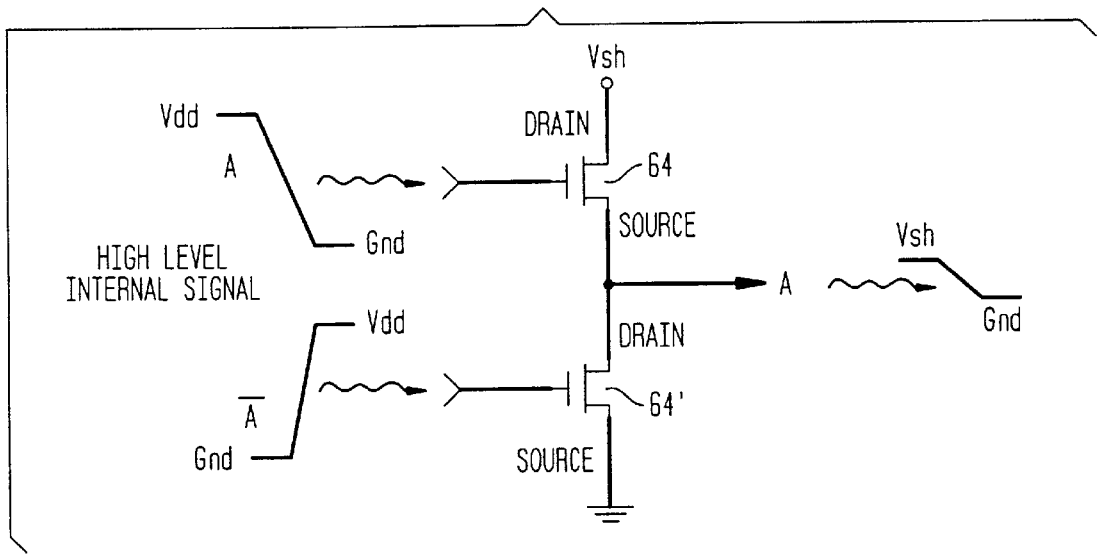

FIG. 6A illustrates the operation of both transistors of the all N channel driver of FIG. 6.

Figure 7:
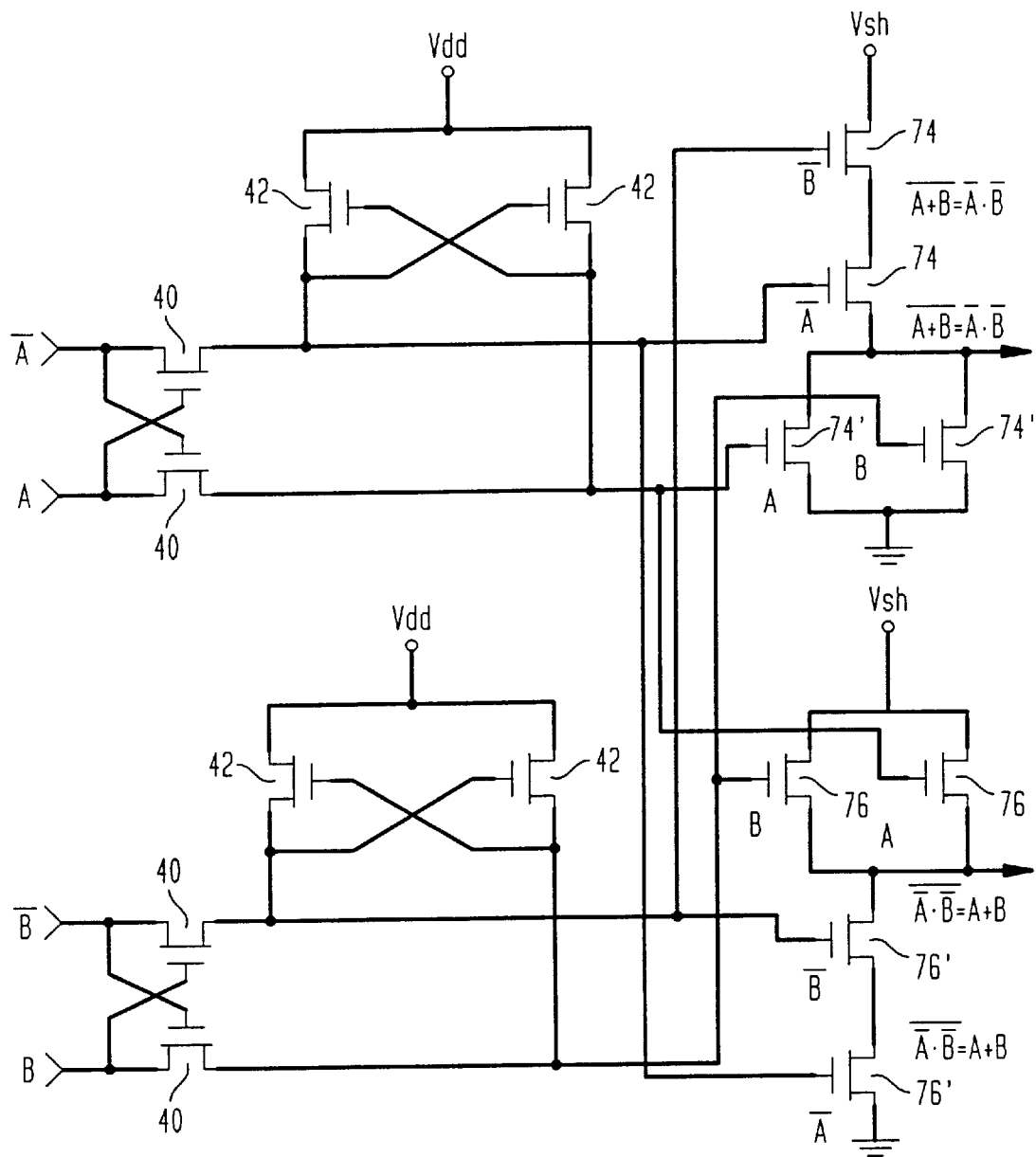

FIG. 7 illustrates a preferred embodiment of an all N channel logic gate which can be either an OR/NOR or an AND/NAND combination simply by reordering the input true complement variables.

Figure 8:
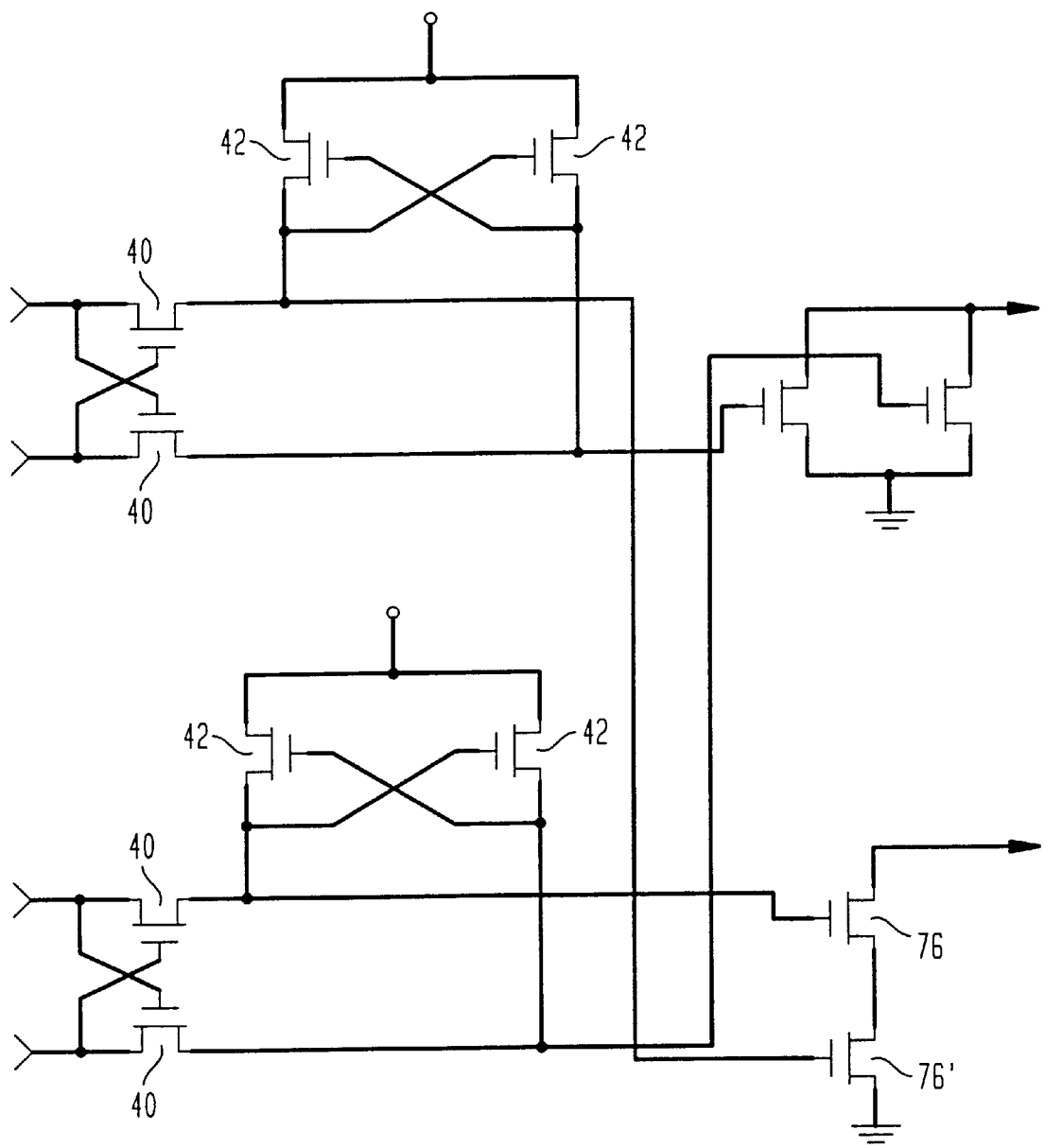

FIG. 8 depicts the same N channel logic circuit configuration as in FIG. 7 for small wiring networks, but with the logic/driver pull up portion removed for circuit simplification.

Figure 9:
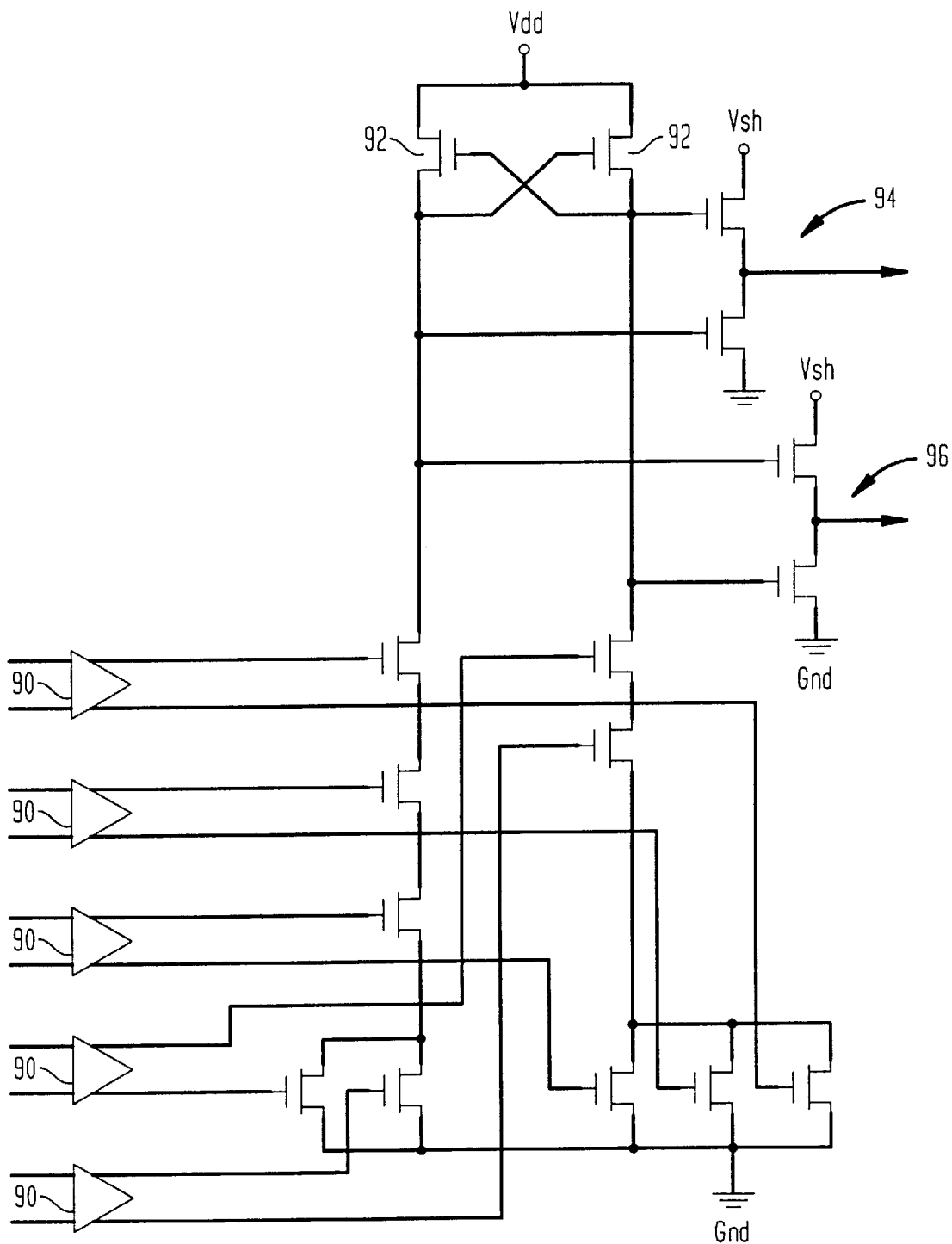

FIG. 9 depicts the present invention adapted for CVS (Cascode Voltage Switch) operation.

Figure 10:
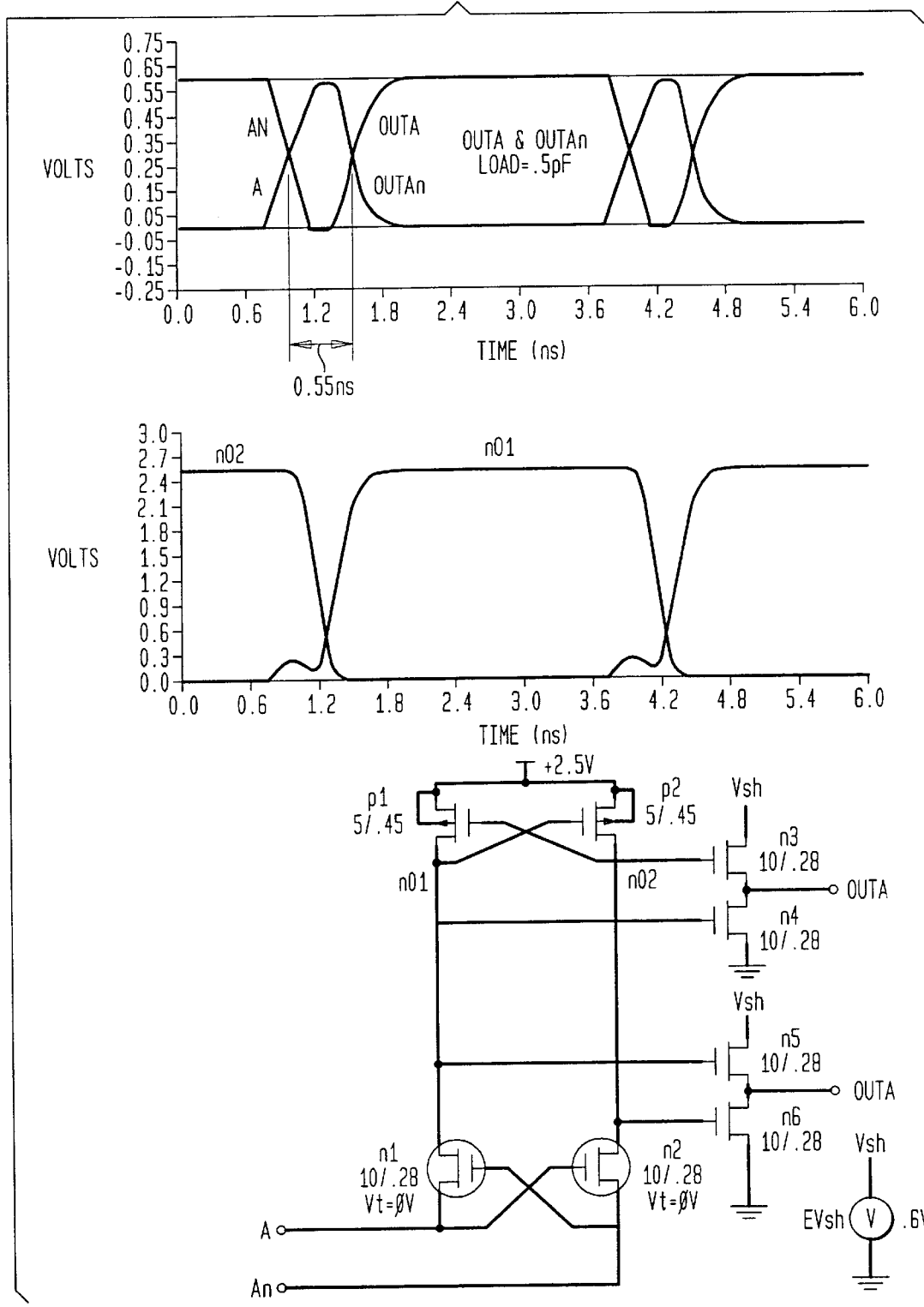

FIG. 10 illustrates simulation results for the circuit of FIG. 6.

FIGS. 11–14 illustrate a further set of logic circuits of the present invention which represents a trade off for improved wireability at the expense of achieving the best noise rejection and the lowest available power dissipation.

Figure 11:
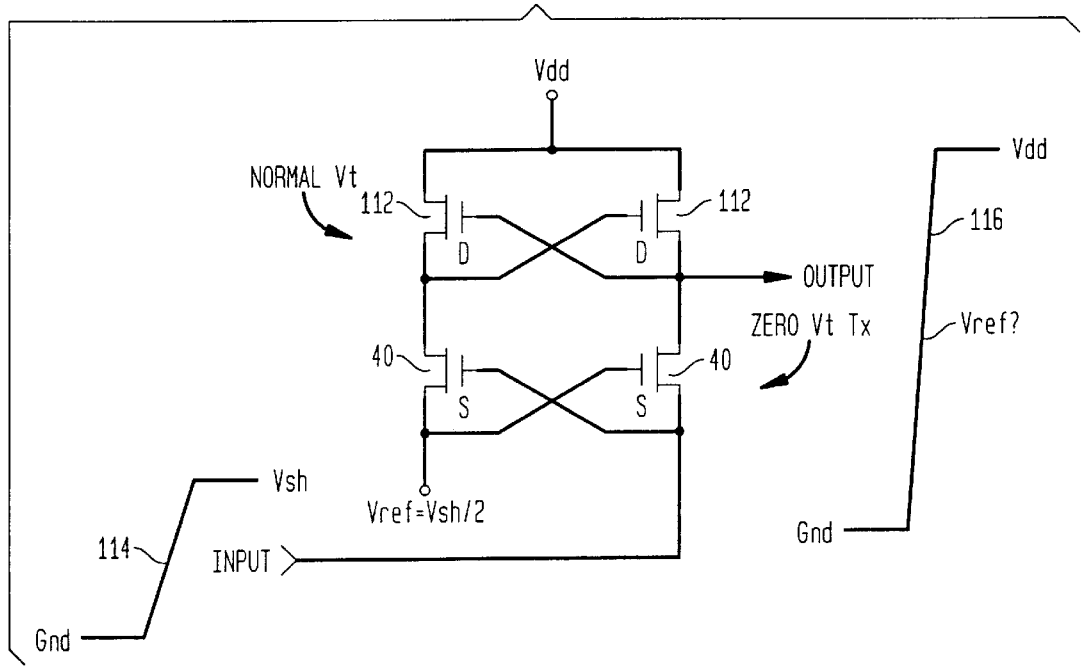

FIG. 11 illustrates a first embodiment of this set of logic circuits having a single sided input in an unbalanced receiver comprising cross coupled (source to gate) N channel and cross coupled (drain to gate) P channel output transistors.

Figure 12:
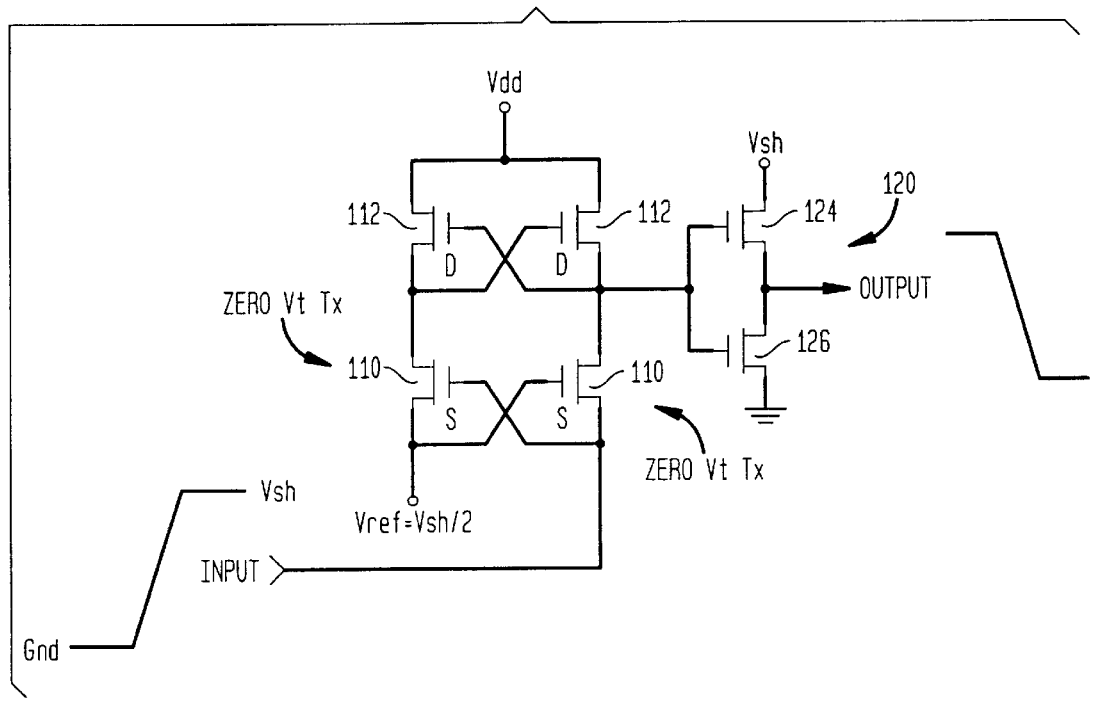

FIG. 12 illustrates a CMOS inverter driven directly by the receiver, using only the in-phase signal.

Figure 13:
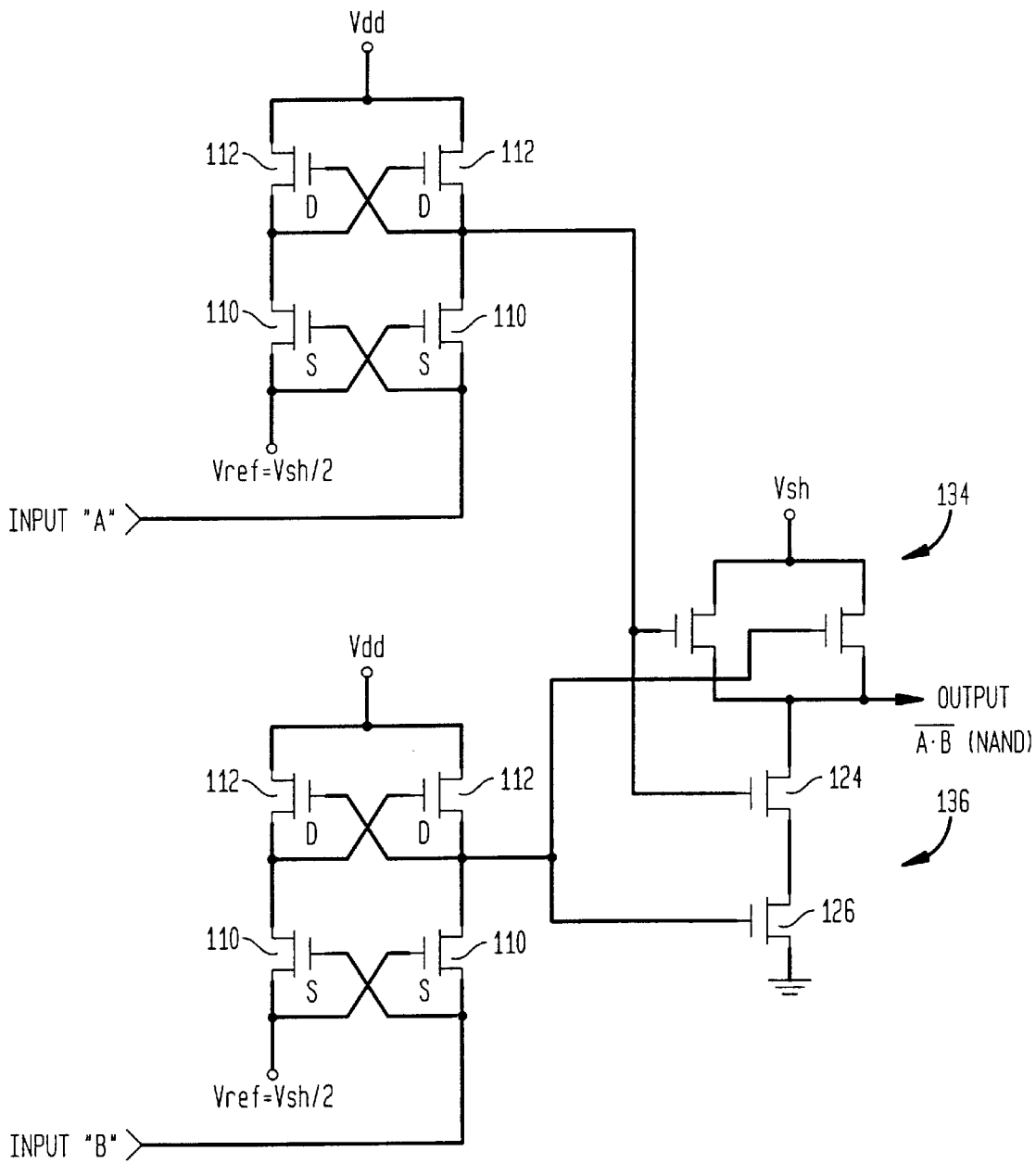

FIG. 13 shows this same concept (in phase signal only) extended to a simple CMOS NAND gate.

Figure 14:
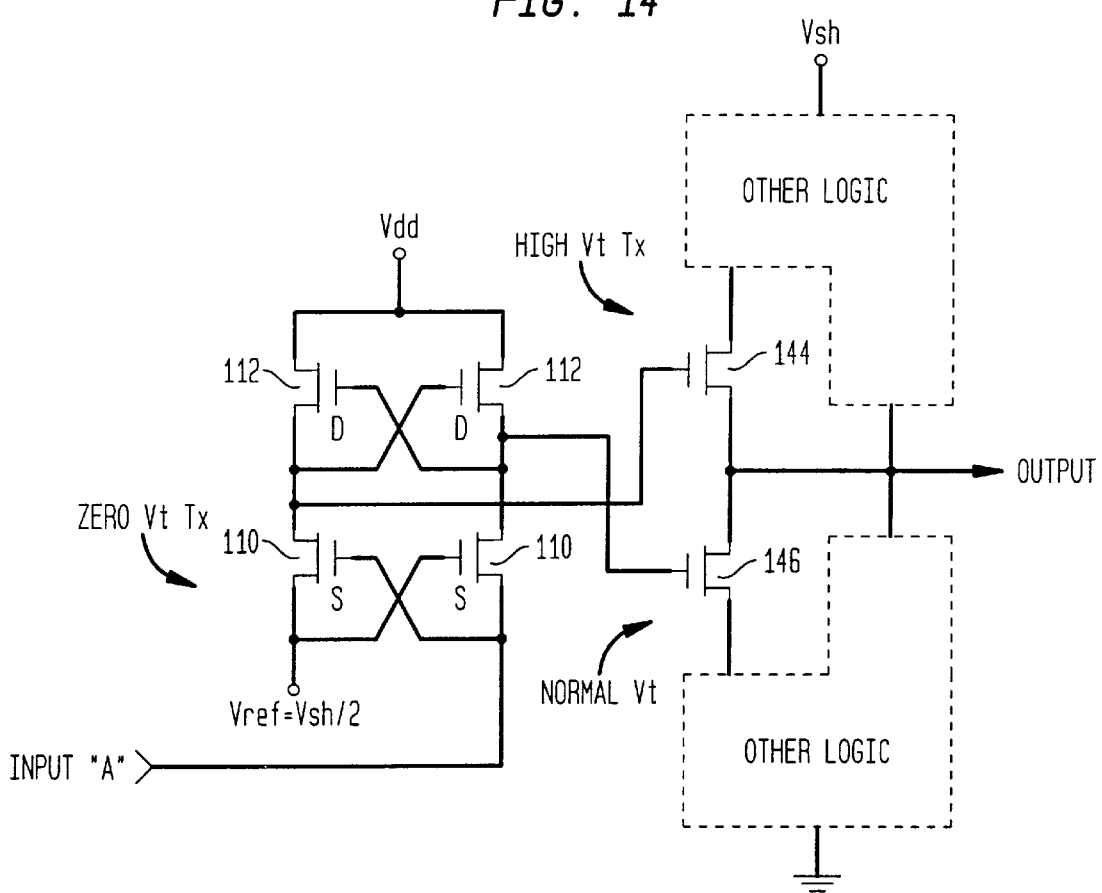

FIG. 14 shows a simple all-N channel inverter/driver, with more complex logic indicated by dashed lines.

DETAILED DESCRIPTION OF THE DRAWINGS

The Receiver Portion of the Invention

Figure 1:
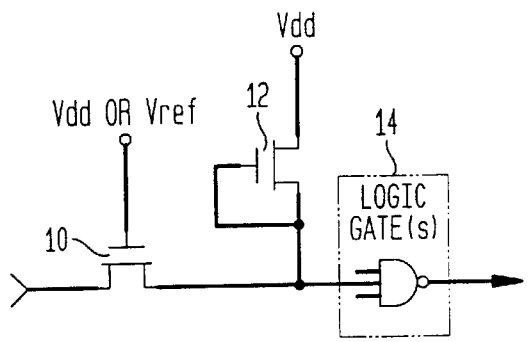
FIG. 1 depicts a relevant prior art circuit developed to reduce logic voltage swings over logic networks while maintaining larger logic signal swings within the logic gates.
Figure 2A:
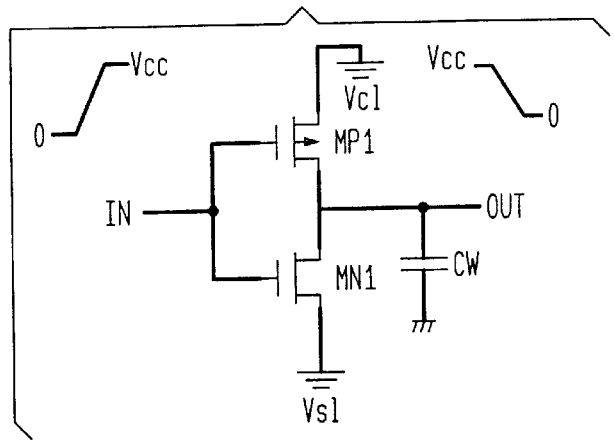
FIG. 2 illustrates an exemplary relevant prior art circuit in CMOS for decreasing the logic voltage swings on logic buses to save power.
Figure 2B:
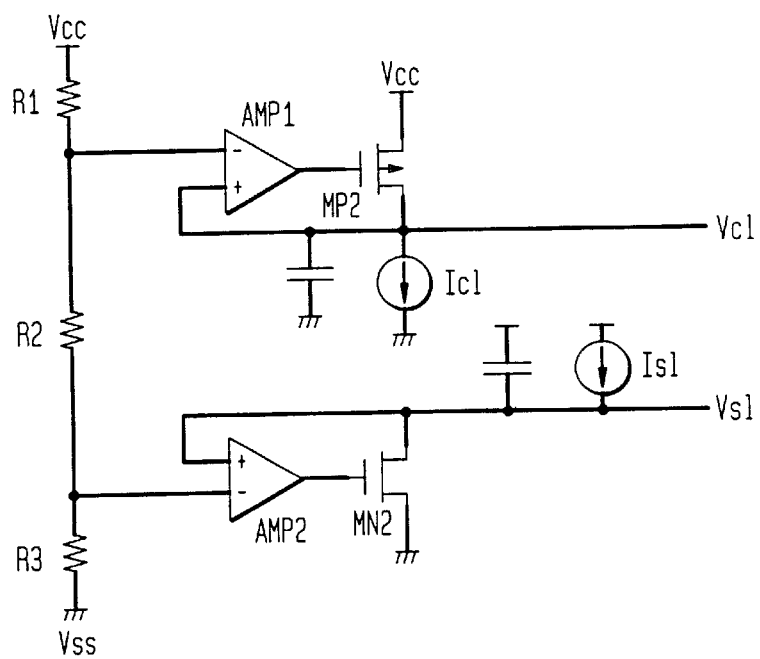
Figure 3:
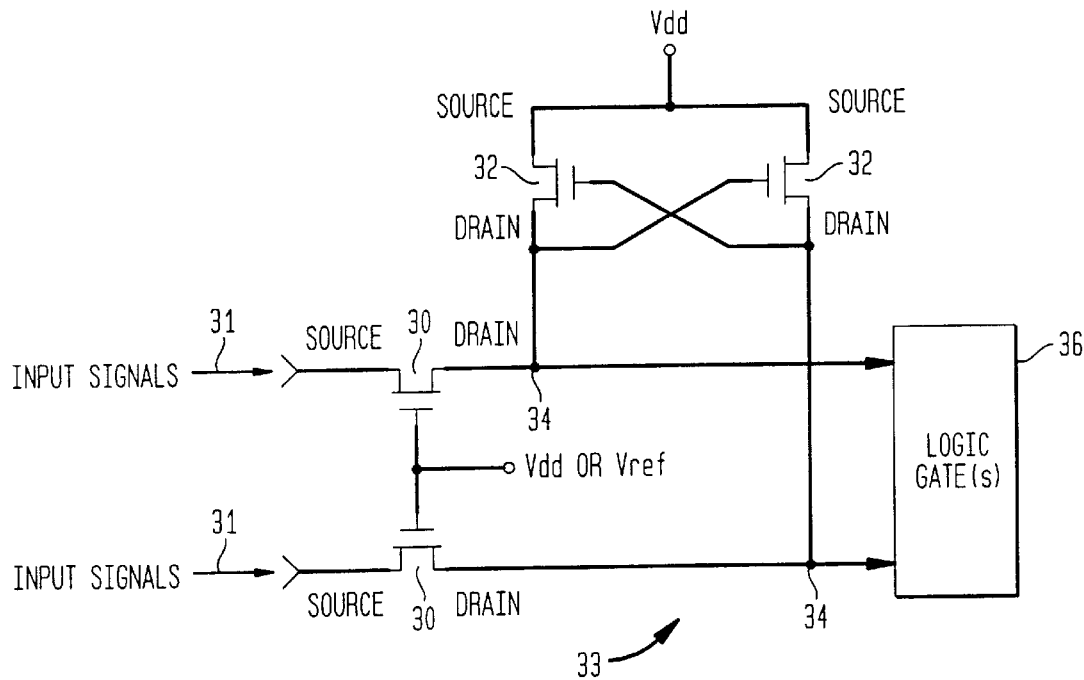
FIG. 3 illustrates a first embodiment of a receiver portion of the present invention in which dual rail complementary logic signals are utilized to improve circuit immunity to external noise and to reduce noise generated by the logic circuit itself.

FIG. 3 illustrates a first embodiment of a receiver portion of the present invention. Dual rail complementary logic signals 31 are utilized to both improve circuit immunity to external noise and to reduce noise generated by the logic family itself. It is noted that the depletion mode input transistor of Knepper has been replaced by a cross coupled pair of P channel output FETs 32. The cross coupled pair further enhances the noise immunity derived from differential sensing, while providing the needed internal pull up necessary for high level internal signals. Two input N channel FETs 30 allow the low level external signals 31 to pull the complementary high level internal signals 33 at internal nodes 34 to ground, which form input to logic gates 36.

FIGS. 4A, 4B and 4C illustrate three preferred embodiments of a receiver portion of the present invention. The fixed gate potential of Knepper and Nakagome has been replaced by cross coupling the two gates to the two sources of the cross coupled input FETs 40. This arrangement is unusual. Cross coupling is normally applied from drain to gate. The cross coupling depicted in FIG. 4 allows both complementary input signals 41 to operate on both input transistors 40 in a push-pull mode. This distinction is important. It allows the input signals to be reduced by an additional factor of 2× while maintaining the performance. The cross coupling can be applied: on the front gate; on the transistor body, as in SOI; or on both the front and the back gates. Applying the cross coupling on both the body and the front gate achieves the greatest signal sensitivity and the best logic gate performance. However, in either case where the incoming signal is applied to the body, care must be taken to limit the amount of forward bias to the source-to-body junction diode. The cross coupled output PFETs 42 add hysteresis to the circuit to prevent crossover at 50%.

FIG. 4B illustrates the two input FETs cross coupled source to back gate.

FIG. 4C illustrates the two input FETs cross coupled source to both front and back gates.

The Driver Portion of the Invention

FIG. 5 illustrates a repeater which comprises a preferred receiver as illustrated in FIG. 4 appended by two traditional CMOS inverter/drivers 54,54' and 56,56'. In this embodiment the two traditional CMOS inverter/drivers are supplied with a reduced voltage power supply Vsh. The embodiment of FIG. 5 is preferred when Vsh is relatively close to Vdd. For simplicity, the input signal is shown cross coupled to only the front gates of the input transistors 50. It should be remembered in the subsequent discussions that signal connections on the body are also applicable. The circuit of FIG. 5 could be used "as is" as a repeater on long signal lines to defeat RC build up and to enhance the performance. The Voltage Vsh is a power supply voltage, which is substantially less than Vdd, and which determines the external signal high level on the output lines.

FIG. 6 depicts the full invention with both preferred receiver and driver portions connected in a repeater with all N channel drivers. The embodiment of FIG. 6 is preferred when Vsh is much less than Vdd. This kind of driver is made possible because the internal operation of the receiver includes both the true and complement signals at high amplitude levels. It should be noted that both transistors 64 and 64', and 66 and 66' of each driver are N channel. The N channel topmost transistor 42 closest to Vsh is wired in a source follower configuration. However, it does not operate like a source follower circuit. Rather, when turned on, it operates in the linear region as a low impedance, non-inverting switch, between the output line 65 and Vsh. In practice, Vdd is four to five times the value of Vsh. So this transistor experiences a great deal of overdrive.

FIG. 6A illustrates the operation of both transistors of the all N channel driver. It should be noted that both N channel transistors experience input voltage signal swings far larger than the output voltage signal swings. Thus the Miller multiplier of the bottom transistor's 64' (or 66') overlap capacitance is reduced from 2× to 1.25×. The topmost transistor 64 (or 66) has no Miller multiplier at all. It provides in-phase current amplification. It is estimated that an All-N-Channel driver of this type can deliver 1.5× the drive of a CMOS driver of equal area.

Expanding the Driver to Include Logic

It should be recalled now that the driver discussed above is possible because the receiver circuit has both true and complement signals of high amplitude relative to the output signal level. These same two factors allow the driver portion of the invention to be expanded to include logic.

FIG. 7 illustrates a preferred embodiment of an all N channel logic gate which can be either a OR/NOR or an AND/NAND combination simply by reordering the input true complement variables.

A brief discussion of the logical operations follows: The two topmost transistors 74,76 in each gate/driver provide in-phase logic (without inversion). The two bottommost transistors in 74',76' each gate/driver provide out-of phase logic (with inversion). The output of the topmost pair is joined to the output of the bottommost pair to provide a push-pull drive at the output terminal.

Like CMOS, this all-N-channel logic draws no current in the quiescent state. When the topmost pair 74,76 are turned on, the bottommost pair 74',76' are turned off. This CMOS-like property is achieved because:
1) both true and complement values of all variables are available from the receivers.
2) the true and complement values are available at high amplitude.
3) the following Boolean Theorems:
*The complement of: "A" Bar dot "B" Bar equals "A" OR
*The complement of "A" OR "B" equals "A" Bar dot "B" Bar.

The receiver circuit provides a limited amount of pull up for the logic network wires. In lightly loaded logic networks no additional pull up may be needed.

FIG. 8 depicts the same N channel logic circuit configuration for small wiring networks as in FIG. 7, but with the logic/driver pull up portion removed for circuit simplification.

The subject invention uses dual rail differential logic signals. This makes it a natural candidate for cascode voltage switch logic.

FIG. 9 depicts the present invention adapted for CVS (Cascode Voltage Switch) operation. The 1984 ISSCC Digest of Technical Papers can be referred to for a discussion of CVS operation.

The circuit of FIG. 9 includes a number of receivers 90 having two N channel transistors and two P channel transistors as illustrated in the circuits of FIG. 4, with the input transistors 40 in a push-pull mode as in the circuit of FIG. 4, and output drivers 94,96 similar to those shown in FIG. 6.

Mix and Match: Universal Interface

The present invention is fully compatible with standard CMOS logic. Because the receiver restores the signal levels internally to Vdd and Ground, conventional CMOS gates can be driven directly from these nodes. Likewise, the output of conventional CMOS gates can be connected directly to any logic/driver input of the present invention.

The logic circuits of the subject invention will also interface between otherwise identical circuits operating at different Vsh or Vdd power supplies. This is because the receiver portion uses differential sensing, and thus no internal logic reference level is needed at the receiving end.

This universal input feature may prove useful in certain circumstances. Examples include: chips with integrated logic blocks at multiple power levels; chips which integrate "heritage" macros; and chip to chip interface circuits. Likewise, the universal input feature could be use to facilitate the introduction of the logic family.

Simulation

FIG. 10 illustrates simulation results for the circuit of FIG. 6 with 2 Vdd to Vsh ratio of 4.16:1. Simulation has shown the receiver circuit also operates satisfactorily with Vdd to Vsh ratios as high as 8:1. It is believed that 4:1 or 5:1 ratios are more practical values. At high ratios the performance can degrade drastically or require large input N channel devices. Moreover as the vdd to Vsh ratio becomes very large, Vsh generated power will no longer dominate the overall power dissipation equation.

The circuit of FIG. 6 has been simulated using Hspice and the transistor models of CMOS7 0.25 lithography DRAM technology. The input N channel thresholds were modified to 0 Vt. Temperature is 85 degrees C. Vdd=2.5 volts. Vsh=0.6 volts. (Vdd/Vsh=4.16) Output Load=0.5 pfd. P channel width=5 u. N channel width=10 u. The results are displayed in FIG. 10. Observe a circuit delay, from 50% of the input to 50% of the output, of 0.55 nsec. The performance is comparable to CMOS circuits of similar complexity in this same technology. Dynamic power consumption, of course, is considerably less.

Tradeoffs will now be discussed.

The embodiments of the present invention described with reference to FIGS. 3–10 require dual rail complementary inputs. On the surface, these circuits would appear to need twice the amount of network wire to deliver twice the number of signals. Experience with other dual rail logic families suggests that while there will be some wire penalty, that penalty will not be nearly this large. An early computer rule of thumb states that a logic family with true and complementary outputs can achieve a given logic function with 20% fewer gates. More recent estimates show many current applications require true/complementary data 30–75% of the time.

Power reduction is achieved at the cost of another power supply. On-chip regulators or on-chip voltage doublers are a viable alternative to derive the second voltage from a single source. Depending upon actual design loading conditions, minimum power may be achieved by making Vsh the principle power source. Voltage doubler circuits are usually more efficient than series resistive voltage regulators. It is noted, however, that the full power savings of the present invention is achieved only with separate power sources. In some applications dual power supplies may be unattractive.

The subject invention doubles the transistor count but removes two power inverters, which together consume 55% of modern CMOS gates. The gate footprint is thus probably comparable to the CMOS gate it replaces. In instances wherein a conventional CMOS design might pose a more attractive footprint, the designer has the option of accomplishing the desired function in conventional CMOS. See the ability to "Mix and Match", discussed above.

FIGS. 11–14 illustrate a further set of logic circuits which represent a trade off for improved wireability at the expense of achieving the best noise rejection and the lowest available power dissipation.

Instead of differential logic signals, inputs to this set of logic circuits are single sided in an unbalanced receiver as illustrated in FIG. 11. The circuit comprises cross coupled (gate to source) N channel transistors 110 and cross coupled drain to gate P channel output transistors 112. The input logic signal 114 is compared to a reference potential (Vref) which is one half of the Vsh supply. The receiver portion operates much as before, with one important distinction: Only the in-phase signal generated by the receiver achieves the full CMOS logic level swing, down to ground potential, as illustrated by the waveform 116. The out of phase signal swings only from Vdd to Vref, and not all the way to ground.

FIG. 12 illustrates a CMOS inverter 120 driven directly by the unbalanced receiver of FIG. 11, using only the in-phase output signal. The receiver 110,112 operates in a manner similar to the receiver 110,112 of FIG. 11, and drives the inverter comprising a P channel device 124 and an N channel device 126 with coupled gates.

FIG. 13 shows this same concept (in phase signal only) extended to a simple CMOS NAND gate, and illustrates an unbalanced receiver with single rail CMOS logic. In this circuit, inputs signals A and B are input to unbalanced receivers comprised of respectively N and P devices 110, 112, the outputs of which are processed by P and N devices 134,136.

The circuits of FIGS. 12 and 13 both achieve output power saving and low output logic swings, similar to the previously described embodiments.

Achieving an all N-channel logic similar to the previously described embodiments requires one further modification. It should be recalled that the out of phase signal generated by the receiver does not reach the full ground DOWN level. Rather, the DOWN level for the out of phase signal is Vref.

FIG. 14 shows a simple all-N channel inverter/driver, with more complex logic indicated by the dashed lines. This circuit is a quasi-balanced receiver with NMOS drivers and logic. In this embodiment, the N channel transistors 144,146 which receive the out of phase signal have their thresholds (Vt) adjusted high to compensate for the high DOWN level.

This set of logic circuits requires as little as half as much signal wire, because both TRUE and COMPLEMENT logic levels are no longer required. However, this set of logic circuits requires an on chip circuit to generate the new supplied level: Vref=Vsh/2. This new reference voltage is supplied to all of the logic blocks. This set of logic circuits also requires a higher logic swing (ground to Vsh) to achieve comparable performance to the previously described embodiments. This set of logic circuits also surrenders some of the noise immunity of the previous embodiments through the loss of common mode rejection in the receiver. All of the different embodiments enjoy improved noise tolerance supplied by the cross coupled P channel FETs.

While several embodiments and variations of the present invention for a very low power logic circuit family with enhanced noise immunity are described in detail herein, it should be apparent that the disclosure and teachings of the present invention will suggest many alternative designs to those skilled in the art.

Having thus described our invention, what we claim as new, and desire to secure by Letters Patent is:

1. A low power digital circuit with enhanced noise immunity comprising:
    an input for receiving differential input signals, the input comprising a first pair of first type input FETs cross-coupled gate-to-source, with each FET receiving one of the differential signals at its source;
    a pair of a second type output FETs cross-coupled gate-to-drain, with the second type FETs having their sources directly coupled to a first voltage terminal, and each second type FET having its drain directly coupled to a separate one of the drains of the first type FET; and
    a first output at a first node between one of the first type FETs drains and one of the second type FETs drains, providing a first output signal having a higher voltage swing than the differential input signals.

2. A digital circuit as in claim 1, further comprising:
    a second output at a second node between another of the first type FET drains and another of the second type FET drains, providing a second output signal complementary to the first output signal.

3. A digital circuit as in claim 2, further comprising:
    a second pair of first type FETs coupled in series between a second voltage terminal and a third voltage terminal, a voltage at the second voltage terminal being intermediate between a voltage at the first voltage terminal and a voltage at the third voltage terminal, wherein the second pair of first type FETs are each gate-coupled to one of the first and second nodes; and
    a third output at a third node between the second pair of first type FETs.

4. A digital circuit as in claim 3, wherein the first pair of first type FETs are low Vt FETs.

5. A digital circuit as in claim 4, wherein the first type FETs are N channel FETs, and the second type FETs are P channel FETs.

6. A digital circuit as in claim 1, wherein the first pair of first type FETs are low Vt FETs.

7. A digital circuit as in claim 1, wherein the first type FETs are N channel FETs, and the second type FETs are P channel FETs.

8. A digital circuit as in claim 1, wherein the two input FETs are cross coupled source to back gate.

9. A digital circuit as in claim 1, wherein the two input FETs are cross coupled source to both front and back gates.

10. A digital circuit as in claim 2, wherein each of the first and second outputs are directed to a CMOS inverter/driver.

11. A digital circuit as in claim 2, wherein each of the first and second outputs are directed to an all N channel logic gate which can be either an OR/NOR or an AND/NAND combination by reordering the input true complement variables.

12. A digital circuit as in claim 1, in a Cascode Voltage Switch.

13. A low power digital circuit with enhanced noise immunity comprising:
    an input for receiving a single sided input signal, the input comprising a pair of first type input FETs cross-coupled gate-to-source;
    a pair of a second type output FETs cross-coupled gate-to-drain, with the second type output FETs having their drains directly coupled to a first voltage terminal, and each second type FET having its source directly coupled to a separate one of the drains of the first type FET;
    an output at a node between one of the first type FETs drains and one of the second type FETs sources, providing output signal having a higher voltage swing than the differential input signals;
    an input logic signal is compared to a reference potential (Vref) which is one half of the Vsh supply.

14. A digital circuit as in claim 13, wherein an in phase signal generated by the receiver achieves the full logic level swing down to ground potential, and the out of phase signal swings only from vdd to Vref, not all the way to ground.

15. A digital circuit as in claim 13, wherein the first type FETs are N channel FETs, and the second type FETs are P channel FETs.

16. A digital circuit as in claim 13, wherein the in phase signal is an input to a CMOS inverter.

17. A digital circuit as in claim 13, in a CMOS NAND gate.

18. A digital circuit as in claim 13, comprising an NMOS inverter/driver coupled to NMOS logic circuitry.

* * * * *

UNITED STATES PATENT AND TRADEMARK OFFICE
CERTIFICATE OF CORRECTION

PATENT NO. : 6,111,425
DATED : August 29, 2000
INVENTOR(S) : Claude L. Bertin, et al.

It is certified that error appears in the above-identified patent and that said Letters Patent are hereby corrected as shown below:

On The Title Page, [56] References Cited, U.S. PATENT DOCUMENTS:

"8/1998" should read --4/1996--

Signed and Sealed this

Fifteenth Day of May, 2001

*Attest:*

NICHOLAS P. GODICI

*Attesting Officer*    *Acting Director of the United States Patent and Trademark Office*